United States Patent
Aakjer

(10) Patent No.: US 6,819,589 B1
(45) Date of Patent: Nov. 16, 2004

(54) FLASH MEMORY WITH PRE-DETECTION FOR DATA LOSS

(75) Inventor: Thomas Aakjer, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 10/438,682

(22) Filed: May 15, 2003

(30) Foreign Application Priority Data

Apr. 29, 2003 (EP) .............................................. 03392005

(51) Int. Cl.⁷ .......................... G11C 16/04; G11C 16/06
(52) U.S. Cl. .............................. 365/185.02; 365/185.21; 365/185.33
(58) Field of Search .......................... 365/185.2, 185.21, 365/185.33

(56) References Cited

U.S. PATENT DOCUMENTS

| | | | |
|---|---|---|---|
| 5,651,128 A | 7/1997 | Gaultier | 395/430 |
| 6,049,899 A | 4/2000 | Auclair et al. | 714/721 |
| 6,201,742 B1 * | 3/2001 | Hirai et al. | 365/185.2 |
| 6,459,620 B1 * | 10/2002 | Eshel | 365/185.21 |
| 6,483,745 B2 | 11/2002 | Saeki | 365/185.04 |
| 6,507,517 B2 * | 1/2003 | Rolandi et al. | 365/185.2 |
| 6,515,905 B2 * | 2/2003 | Hikida | 365/185.2 |
| 6,525,960 B2 | 2/2003 | Yoshida et al. | 365/185.03 |
| 6,650,570 B2 * | 11/2003 | Tanzawa et al. | 365/185.2 |
| 6,687,162 B1 * | 2/2004 | Hsueh et al. | 365/185.21 |

FOREIGN PATENT DOCUMENTS

EP        1182669 A2      2/2002    ............ G11C/29/00

OTHER PUBLICATIONS

U.S. patent application Publication U.S. 2002/0181279A1 to Yoshida et al., Pub. date Dec. 5, 2002, filed Jun. 29, 1999.

* cited by examiner

Primary Examiner—Trong Phan
(74) Attorney, Agent, or Firm—George O. Saile; Stephen B. Ackerman; Douglas R. Schnabel

(57) ABSTRACT

A new method to detect and to correct a weakly programmed cell in a nonvolatile memory device is achieved. The method comprises providing a plurality of nonvolatile memory cells. A means to read a selected cell compares the performance of the selected cell with the performance of a reference cell. A read state of the selected cell is high if the selected cell exceeds the reference cell. The read state of the selected cell is low if the selected cell exceeds the reference cell. A first read state is obtained by reading the selected cell with the reference cell biased to a first value. A second read state is obtained by reading the selected cell with the reference cell biased to a second value that is greater than the first value. The selected cell is flagged as weakly programmed, high if the first and second read states do not match. A third read state is obtained by reading the selected cell with the reference cell biased to a third value that is less than the first value. The selected cell is flagged as weakly programmed, low if the first and third read states do not match. The selected cell is refreshed if the selected cell is weakly programmed.

28 Claims, 5 Drawing Sheets

FLASH MEMORY WITH PRE-DETECTION FOR DATA LOSS

BACKGROUND OF THE INVENTION (1) Field of the Invention

The invention relates to a nonvolatile memory device, and, more particularly, to a method and a circuit to prevent data retention errors in a nonvolatile memory device.

(2) Description of the Prior Art

Nonvolatile memory is a critical component in microprocessor-based systems. Maximum system flexibility is achieved through the use of nonvolatile, re-programmable memories such as flash memory. By storing operating programs or key system parameters in flash memories, system performance can be rapidly, and permanently, changed in the field.

Referring now to FIG. 1, an exemplary flash memory cell is illustrated in schematic 22 and cross sectional 10 forms. The flash cell 10 is a form of a MOS transistor having a source 16 and drain 14 formed in a substrate region 12. A complex gate is formed comprising a control gate (CG) 20 and a floating gate (FG) 18. The transistor may be operated by biasing the control gate 20, drain 14 and source 16 as is well known in the art. The floating gate 18 comprises a conductive region electrically isolated from the substrate 12 by a first dielectric region 17 and electrically isolated from the control gate 20 by a second dielectric region 19. As in any MOS transistor, the device is turned ON when a sufficient bias is applied to the control gate 20 to create a channel region of to carry charge from the drain 14 to the source 16. The necessary control gate bias is defined as a threshold voltage ($V_{TH}$). As is well known in the art, charge, in the form of electrons, may be injected into or out from the floating gate 18. The presence of charge on the floating gate 18 will alter the $V_{TH}$ of the device 10. This fact may be used to create a digital memory cell where a first state is defined by a large presence of charge and a second state is defined by an absence of charge. To program or erase the state of the cell 10, relatively large voltage biases may be applied to a combination of control gate 20, drain 14, and source 16 to cause the injection of charge into the floating gate 18 or to cause the removal of charge from the floating gate 18. To read the state of the cell 10, the control gate 20 may be biased to a voltage whereby the device should be ON or should be OFF, depending on the charged state of the floating gate. A voltage bias from drain 14 to source 16 will cause a current to flow if the device is ON. This current flow, or the absence or this current flow, may be detected to determine to state of the cell 10 as is well known in the art.

Referring now to FIG. 2, an exemplary diagram of a circuit for the reading a flash cell is illustrated. A section 30 of an integrated circuit device is illustrated showing an array 32 of nonvolatile cells. A particular cell 34 of the memory array is selected by asserting its wordline WL 42 and bit line BL by methods well known in the art. The WL voltage is connected to the control gate of the cell 34 and the BL voltage $V_{BL}$ is connected to the drain. The cell current $I_{CELL}$ is the drain-to-source current ($I_{DS}$) of the cell 34. If the cell threshold voltage ($V_{TH}$) exceeds the WL voltage, then the cell 34 will be OFF and $I_{CELL}$ will be very small. If the cell $V_{TH}$ is less than the WL voltage, then the cell 34 will be ON and $I_{CELL}$ will be much larger.

To determine the relative $V_{TH}$, and therefore the cell 34 logic state, a reference cell 36 is used. The reference cell 36 comprises a comparable flash device having a fixed $V_{TH}$.

The reference cell 36 control gate is biased to a reference voltage $V_{REF}$ and the drain is biased to a bit line voltage $V_{BL}$. A reference current $I_{REF}$ is generated. A comparitor 40 is used to compare the reference current $I_{REF}$ with the cell current $I_{CELL}$. The comparitor output 46 is the decoded CELL STATE, which is either high or low.

The logic state of each cell in a flash memory array is typically tested at the factory following programming. Theoretically, the isolated floating gate and the solid state character of the device should create very long data retention times. However, it is known in the art there is a statistical distribution to the retention capabilities of cells and that some data cells will exhibit substantially shorter data retention times than the average. It is further found that these leaky cells, have a non-constant amount of floating gate charge over time. If, for example, a cell is fully charged during programming, then the cell will initially read the correct cell state of 'X' but later will read an incorrect cell state of 'Y' when the floating gate has become sufficiently discharged. In the field, this shortened data retention cell may create a single bit failure, as opposed to a grouped or burst failure. In certain applications, especially automotive or industrial control systems, a product malfunction due to such a memory error is a serious matter. Therefore, it is of great advantage to prevent such memory errors.

Several prior art inventions relate to methods to detect bit errors in nonvolatile memories. U. S. Pat. No. 6,483,745 B2 to Sacki teaches a method and a circuit to detect and to correct soft errors in a nonvolatile cell. The cell is read three times using three different reference transistors. One reference is the standard reading reference, one reference is for a programmed state threshold, and one reference is for an erase state threshold. By comparing the results of each of the three reads, the cell state and margin can be determined. U.S. Pat. No. 6,049,899 to Auclair et al describes a method and a circuit to detect soft errors in a nonvolatile memory array. Cells are read using variable control gate voltages or using variable reference currents to thereby assess the state and margin of the cell. Cells with inadequate margin are refreshed. U.S. Pat. No. 6,525,960 B2 to Yoshida et al discloses a method and a circuit to write a multiple value, nonvolatile memory array. A method to correct erratic cells is disclosed.

SUMMARY OF THE INVENTION

A principal object of the present invention is to provide an effective and very manufacturable integrated circuit device.

A further object of the present invention is to provide a method to detect and to correct weak cell states in a nonvolatile memory device.

A yet further object of the present invention is to prevent bit errors in a nonvolatile memory device.

A yet further object of the present invention is to selectively refresh memory cells in a nonvolatile memory device in an efficient method.

A yet further object of the present invention is to provide a method to continuously detect weak cell states.

A yet further object of the present invention is to provide a method for multiple level nonvolatile memory as well as for binary nonvolatile memory.

Another further object of the present invention is to provide a nonvolatile memory device capable of detecting weak cell states.

In accordance with the objects of this invention, a method to detect and to correct a weakly programmed cell in a nonvolatile memory device is achieved. The method comprises providing a plurality of nonvolatile memory cells. A means to read a selected cell compares the performance of the selected cell with the performance of a reference cell. A read state of the selected cell is high if the selected cell exceeds the reference cell. The read state of the selected cell is low if the selected cell exceeds the reference cell. A first read state is obtained by reading the selected cell with the reference cell biased to a first value. A second read state is obtained by reading the selected cell with the reference cell biased to a second value that is greater than the first value. The selected cell is flagged as weakly programmed, high if the first and second read states do not match. A third read state is obtained by reading the selected cell with the reference cell biased to a third value that is less than the first value. The selected cell is flagged as weakly programmed, low if the first and third read states do not match. The selected cell is refreshed if the selected cell is weakly programmed.

Also in accordance with the objects of this invention, a nonvolatile memory device is achieved. The device comprises a plurality of nonvolatile memory cells and a means to determine a read state of a selected cell by comparing performances of the selected cell and of a reference cell. The reference cell has a gate biased to a read value. The read state is an upper value or a lower value based on the comparison. The means to determine a read state further comprises a first reference cell with a gate set to a first value. A first comparitor is coupled to the reference cell and to the selected cell. The first read state is the output of the first comparitor. A second reference cell has a gate set to a second value. A second comparitor is coupled to the reference cell and to the selected cell. The second read state is the output of the second comparitor. A third reference cell has a gate set to a third value. A third comparitor is coupled to the reference cell and to the selected cell. The third read state is the output of the third comparitor.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose methods to detect and to correct weakly programmed flash memory cells. Architectures to read flash memory cells are illustrated. It should be clear to those experienced in the art that the present invention can be applied and extended without deviating from the scope of the present invention.

Figure 1:
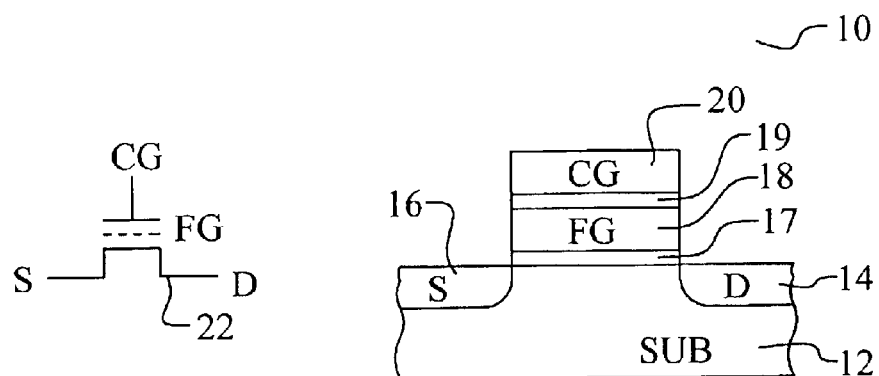
FIG. 1 illustrates a prior art, nonvolatile memory cell.
Figure 2:
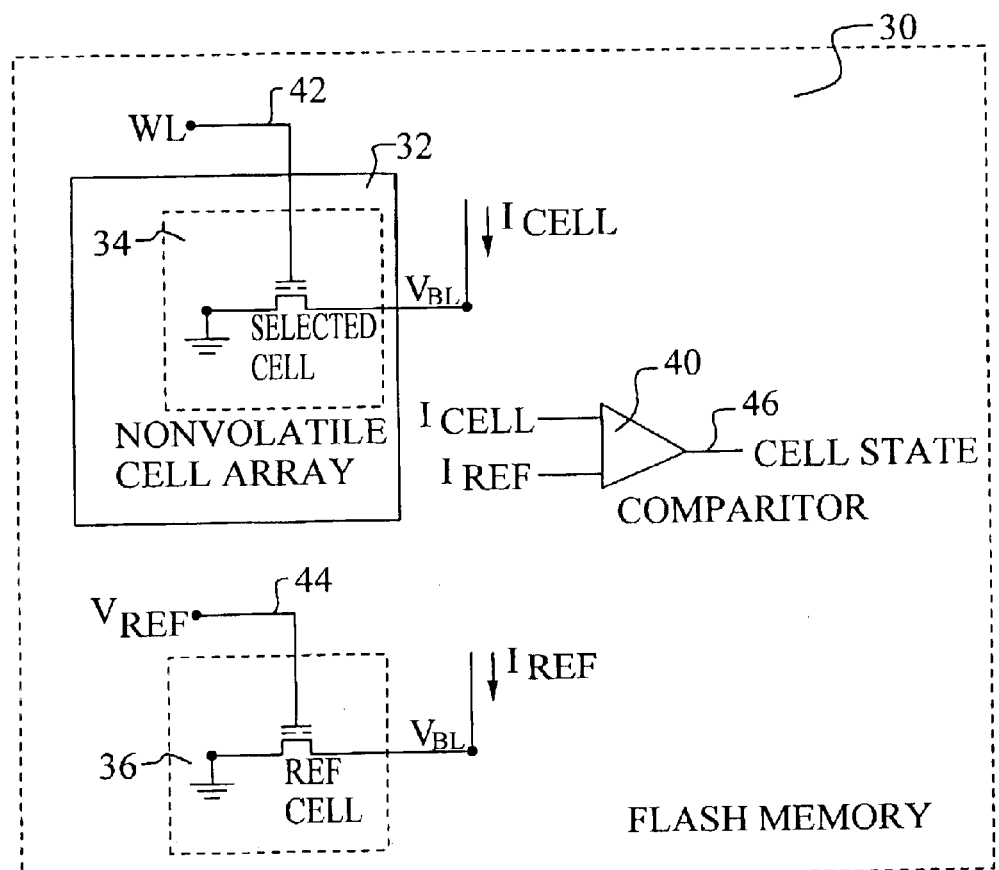
FIG. 2 illustrates a prior art method to read a selected cell in a nonvolatile memory.
Figure 3:
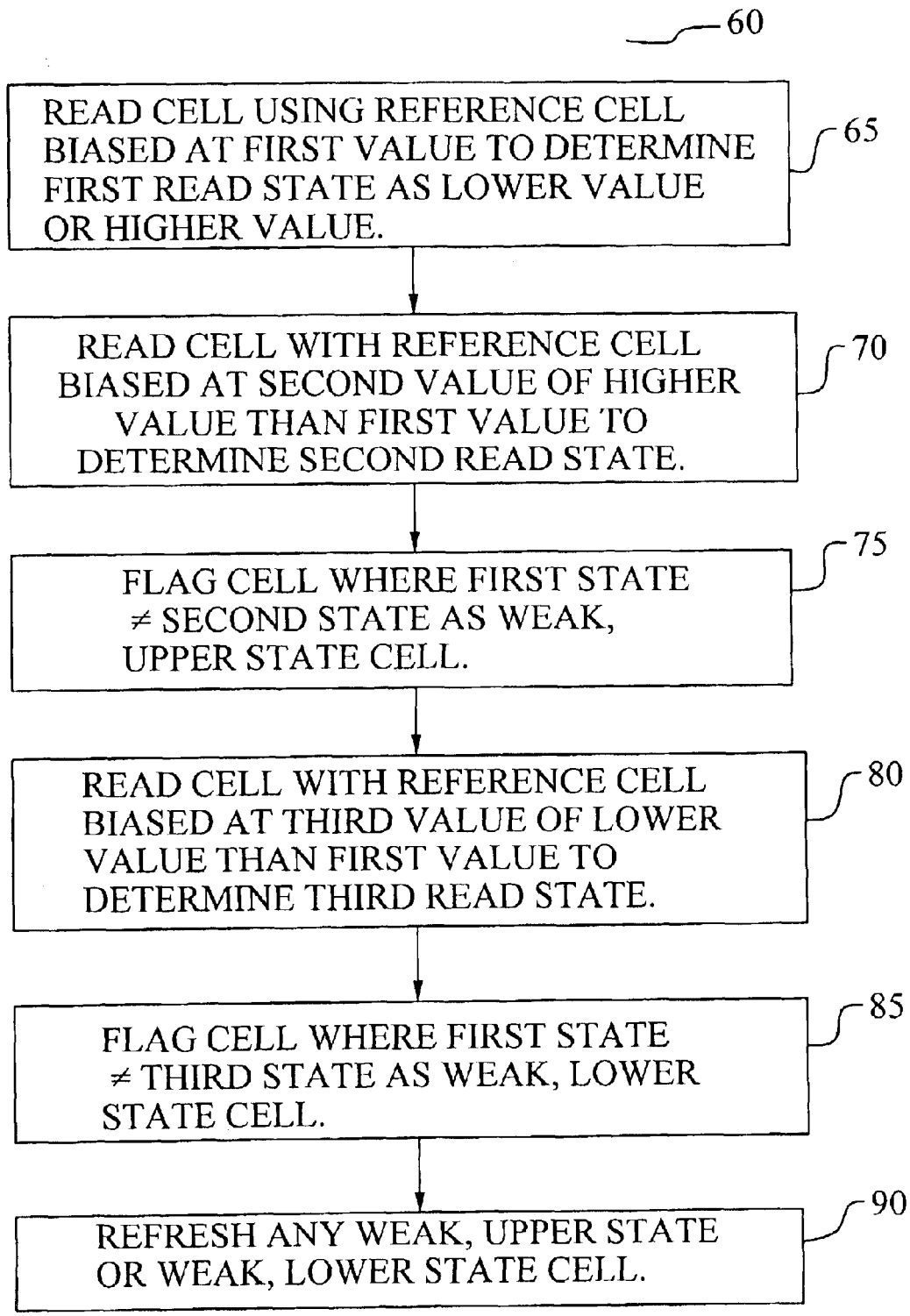
FIG. 3 illustrates the preferred embodiment of the method of the present invention.

Referring now to FIG. 3, the preferred embodiment of the method 60 of the present invention is illustrated. Several important features of the present invention are shown and discussed below. This method 60 is further illustrated by a first embodiment device shown in FIG. 4 that is referenced during this description. Referring again to FIG. 4, a first preferred embodiment of an integrated circuit device 100 is illustrated. This device 100 comprises an array 104 of nonvolatile devices. The nonvolatile cells may comprise flash cells formed using any of the well-known configurations and methods. Stacked gate or split-gate devices may be used. Further, various addressing architectures could be used as are well-known in the art. A particular cell 106 is illustrated as a "selected" cell within the array. As key features, means of addressing and biasing allow a fixed reading bias to be forced onto the WL 122 for the cell 106 and a fixed BL bias $V_{BL}$ to be forced onto the drain of the cell 106 such that a cell current $I_{CELL}$ is generated. As in the prior art device described above, it is assumed that the relative cell current $I_{CELL}$ will depend on the threshold voltage $V_{TH}$ of the selected cell 106. Finally, the $V_{TH}$ will further depend on the stored charge on the floating gate of the cell 106.

A means 108 to determine a read state of a selected cell 106 by comparing the performance of the selected cell 108 and the performance of several reference cells 110, 114, and 118 is included. In particular, the means 108 to determine the read state comprises a first reference cell 110 and first comparitor 138, a second reference cell 114 and second comparitor 146, and a third reference cell 118 and third comparitor 154. With this novel arrangement, the drain current $I_{CELL}$ of the selected cell 106 can be independently compared with three different, reference cell drain currents $I_{NORM}$, $I_{UPPER}$, and $I_{LOWER}$. The first reference cell control gate is biased to a first read value ($V_{NORM}$). This first read value $V_{NORM}$ 126 preferably equals a mid point between an upper state value and a lower state value. The first reference cell 110 drain current $I_{NORM}$ is compared to the selected cell 106 using the first comparitor 138. The output 142 of the first comparitor 138 is the first read state (CELL STATE1). For example, if $I_{CELL}$ exceeds $I_{NORM}$, then CELL STATE1 is "upper state" (which may be further defined as a "1" or a "0"). If $I_{CELL}$ is less than $I_{NORM}$, then CELL STATE1 is "lower state". The first comparitor 138 is therefore configured to perform a typical reading function as in the prior art.

As an important feature, a second reference cell 114 and second comparitor 138 provide a means to test the selected cell 106 against a second threshold level $V_{UPPER}$ 130 that is higher than the normal, first reading threshold $V_{NORM}$ 126. The control gate of the second reference cell 114 is set to the second read value $V_{UPPER}$ 130 during a read operation. The drain current $I_{UPPER}$ generated by the second reference cell 114 may be compared to the selected cell 106 drain current $I_{CELL}$ using the second comparitor 146. The second read state CELL STATE2 is the output 150 of the second comparitor 146. In the preferred configuration, CELL STATE2 is "upper state" if $I_{CELL}$ exceeds $I_{UPPER}$ and CELL STATE2 is "lower state" it $I_{CELL}$ is less than $I_{UPPER}$. In similar fashion, the third reference cell 118 and third comparitor 154 provide an means to test the selected cell against a third threshold level, $V_{LOWER}$ 134, that is below the standard reading value of $V_{NORM}$ 126. The control gate of the third reference cell 118 is set to the third read value $V_{LOWER}$ 134 during a read operation. The drain current $I_{LOWER}$ generated by the third reference cell 118 may be compared to the selected cell 106 drain current $I_{CELL}$ using the third comparitor 154. The third read state CELL STATE3 is the output 158 of the third comparitor 154. In the preferred configuration, CELL STATE3 is "upper state" if $I_{CELL}$ exceeds $I_{LOWER}$ and CELL STATE3 is "lower state" if $I_{CELL}$ is less than $I_{LOWER}$.

Figure 4:
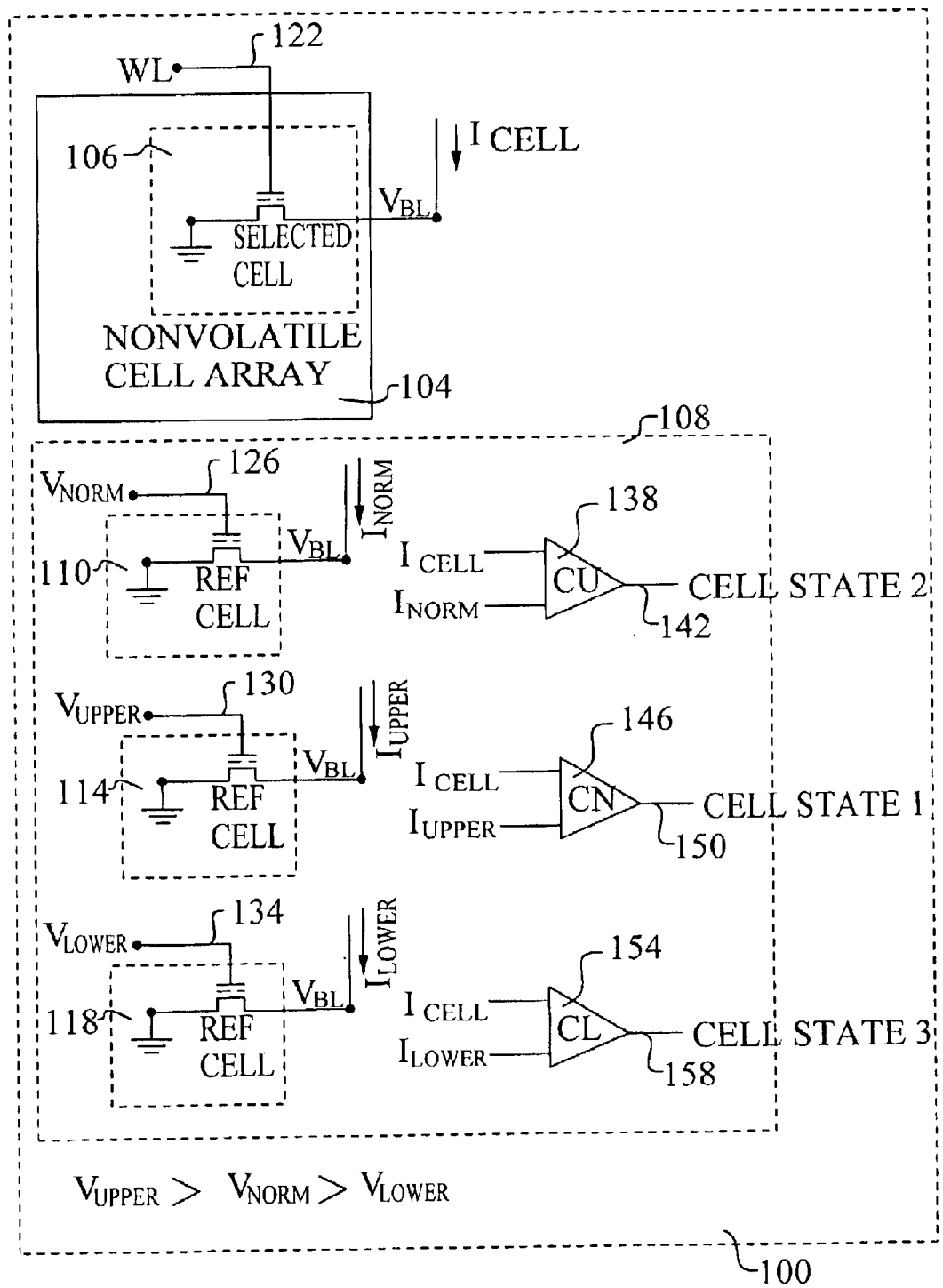
FIG. 4 illustrates a first preferred embodiment of the device of the present invention.

Referring again to FIG. 3, the preferred method 60 to detect and to correct weak cells states in the above-described nonvolatile memory device is now described. The method 60 comprises, first, reading selected cells using a first read value to determine a first read state in step 65. The selected cells may comprise a group of cells, such as a byte (8 bits) or a word (16 bits). However, each cell, or bit, is read individually using a first reference cell 110 and comparitor 138 as shown in FIG. 4.

Referring again to FIG. 3, the selected cells are read at a second read value where that second read value is greater than the first read value in step 70. Referring again to FIG. 4, this second read corresponds to reading using the second reference cell 114 biased at the second reference value $V_{UPPER}$ and compared using the second comparitor 146. Referring again to FIG. 3, as an important step, any cells wherein the second read state does not match the first read state are flagged as weak, upper state cells in step 75. Referring again to the embodiment of FIG. 4, a comparison is made of the CELL STATE2 150 reading and the CELL STATE1 142 reading, If CELL STATE2 does not equal CELL STATE1 for a selected cell 106, then it can be concluded that the cell 106 is programmed to the "upper" state. In addition, it can also be concluded that the cell is only weakly programmed to the "upper" state. In other words, while the first reading comparitor 142 indicates that the cell is in the "upper" state, the cell 106 has experienced discharging to an extent that it no longer passes the more stringent $V_{UPPER}$ threshold. According to the teachings of this invention, the cell 106 is in danger of failing. Alternatively, if CELL STATE2 equals CELL STATE1, then either the cell 106 is in the "lower" state or the cell 106 is strongly in the "upper" state and, therefore, not in danger of failing.

Referring again to FIG. 3, the selected cells are read at a third read value of less than the first read value in step 80. Referring again to FIG. 4, this third read corresponds to reading using the third reference cell 118 biased at the third reference value $V_{LOWER}$ and compared using the third comparitor 154. Referring again to FIG. 3, as an important step, any cells wherein the third read state does not match the first read state are flagged as weak, lower state cells in step 85. Referring again to the embodiment of FIG. 4, a comparison is made of the CELL STATE3 158 reading and the CELL STATE1 142 reading, If CELL STATE3 does not equal CELL STATE1 for a selected cell 106, then it can be concluded that the cell 106 is programmed to the "lower" state. In addition, in can be concluded that the cell 106 is only weakly programmed to the "lower" state. In other words, while the first reading comparitor 142 indicates that the cell is in the "upper" state, the cell 106 has experienced discharging to an extent that it no longer passes the more stringent $V_{LOWER}$ threshold. According to the teachings of this invention, the cell 106 is in danger of failing. Alternatively, if CELL STATE3 equals CELL STATE1, then either the cell 106 is in the "upper" state or the cell 106 is strongly in the "lower" state and, therefore, not in danger of failing.

Referring again to FIG. 3, any weak, "upper" state or weak, "lower" state cells are refreshed in step 90. That is, by comparing the first, second, and third reads as described above, the method of the present invention can detect specific, weakly-programmed bit cells in the nonvolatile array. These weakly-programmed cells represent potential bit errors to the memory system. The memory system responds by reprogramming these cells to their existing state, whether "upper" or "lower" such that these cells are returned to a strongly programmed condition.

Figure 5:
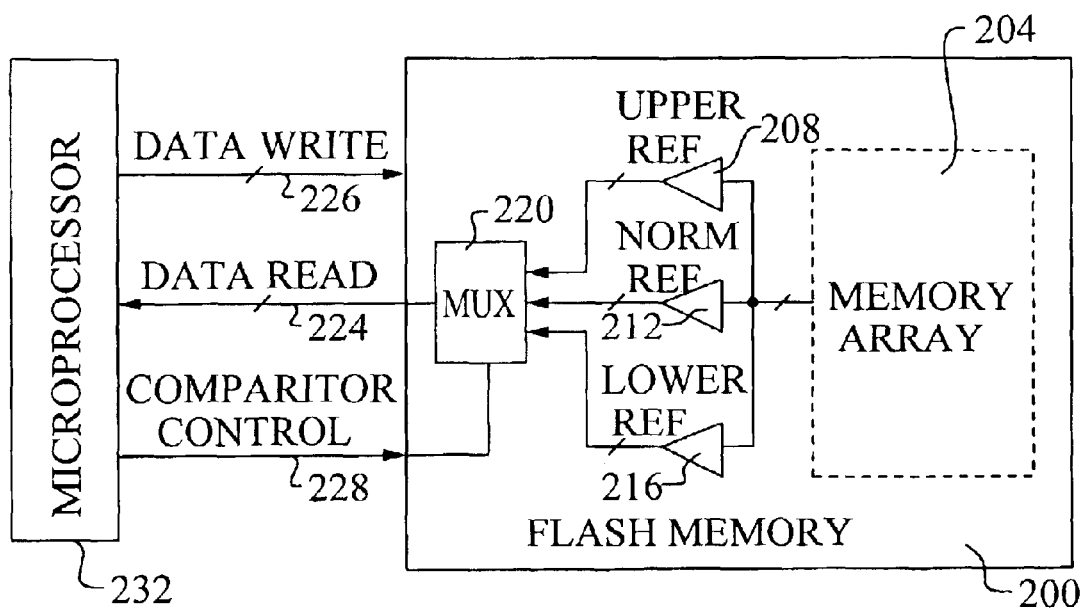
FIG. 5 illustrates a second preferred embodiment of the device of the present invention.
Figure 6:
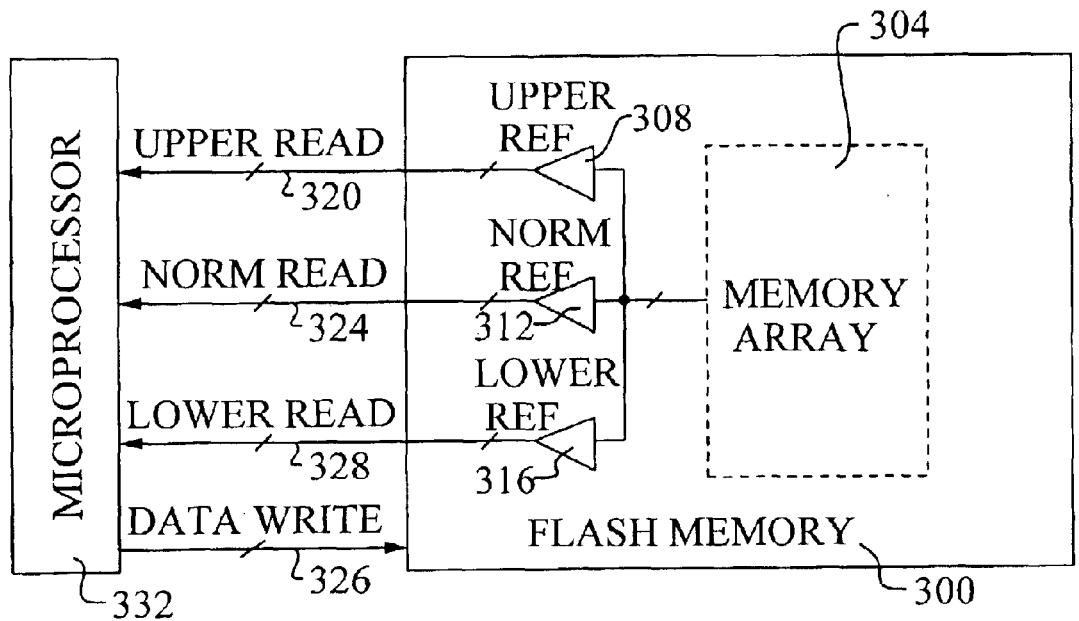
FIG. 6 illustrates a third preferred embodiment of the device of the present invention.

Referring now to FIGS. 5 and 6, second and third preferred embodiments of devices of the present invention are illustrated. Each of these embodiments shows a flash memory device incorporating three reading comparitors, as described above, along with a microprocessor device. Referring specifically to FIG. 5, the second embodiment shows a flash memory 200 and a microprocessor 232. The flash memory 200 comprises a nonvolatile memory array 204, and a reading section further comprising a normal comparitor 212, an upper comparitor 208, and a low comparitor 216. As an additional important feature, a means 220 to select and to present a particular reading channel to the flash memory output 224 is shown. A signal 228 from the microprocessor is used to select any one of the normal, upper, and lower thresholds data reads as the data read value 224, on a byte (8 bits) or a word (16 bits) basis, to be input into the microprocessor 232.

The microprocessor device 232 normally reads out the data value, through the data read channel 224, using the normal threshold comparitor 212. An entire section, or block, of the memory array 204 may thus be transferred into the microprocessor device 232 and then stored in a secondary memory structure, such as a RAM. Next, the microprocessor device 232 may enter a test mode in which the comparitor control signal 228 selects either the upper reference comparitor or the lower reference comparitor for data reading. For example, the section of the memory array 204 may be read out using the upper threshold reference comparitor 208. The microprocessor device can then compare the upper threshold data reads to the normal threshold data reads stored in the RAM. The microprocessor device 232 can then flag any bit where the normal and upper threshold reads do not agree as a "weak" bit that should be refreshed. The microprocessor device 232 can then refresh these bit locations by writing these locations through the DATA WRITE line 226.

Similarly, the microprocessor device 232 may enter a test mode in which the comparitor control signal 228 selects the lower reference comparitor LOWER REF 216. The microprocessor device can then compare the lower threshold data reads to the normal threshold data reads stored in the RAM. The microprocessor device 232 can flag any bit where the normal and lower threshold reads do not agree as a "weak" bit that should be refreshed. The microprocessor device 232 can then refresh these bit locations by writing these locations through the DATA WRITE line 226.

Referring again to FIG. 6, the third preferred embodiment of the device of the present invention is illustrated. In this embodiment, the flash memory device 300 comprises a memory array 304 and a means of reading further comprising a NORMAL threshold comparitor 312, a UPPER threshold comparitor 308, and a LOWER threshold comparitor 316. In this embodiment, each of the threshold comparitors 308, 312, and 316 is output from the flash memory device 300 on every read operation through the UPPER READ 320, NORM READ 324, and LOWER READ 328 buses. It is possible, therefore, for the microprocessor device 332 to continuously monitor incoming read data for "weak" data bits. As a preferred approach, every bit of the incoming data bytes/words on the UPPER READ 320, NORM READ 324, and LOWER READ 328 lines is filtered by the microprocessor device 332 using a voting scheme to detect and correct weak bits as shown in TABLE 1 below. Where data bits are detected as "weak", then these bits are refreshed by the microprocessor device 332 using the DATA WRITE bus 326.

TABLE 1

Voting Scheme for Detection and Correction of Weak Bits

| UPPER THRESHOLD | NORMAL THRESHOLD | LOWER THRESHOLD | VOTING VALUE |
|---|---|---|---|
| LOW | LOW | LOW | LOW |
| LOW | LOW | HIGH | LOW, NEEDS REFRESH |
| LOW | HIGH | HIGH | HIGH, NEEDS REFRESH |
| HIGH | HIGH | HIGH | HIGH |

Figure 7:
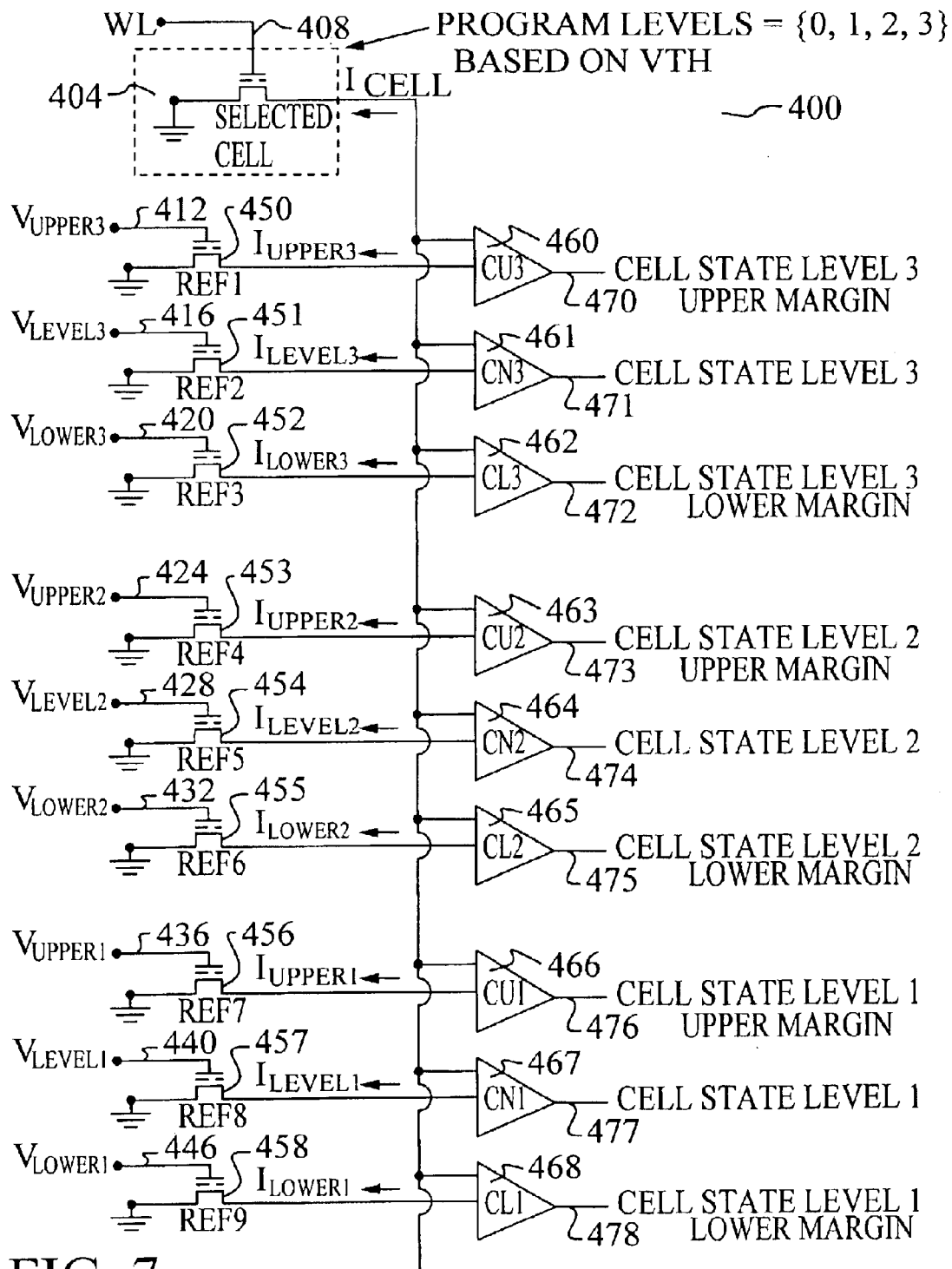
FIG. 7 illustrates a fourth preferred embodiment of the device of the present invention.

Referring now to FIG. 7, a fourth embodiment of the present invention is illustrated. In the previous embodiments, the nonvolatile memory cells are programmed to binary levels of '0' or '1'. The present invention is extendible to nonvolatile memories that are programmable to multiple levels. For example, the cell may be programmed to any of three levels. In that case, the cell can take on the values 0, 1, or 2. A further extension of the idea is shown in FIG. 7. Here, the selected cell 404 is programmable to any of 4 levels (0, 1, 2, or 3). To read such a cell 404, three comparators CN1 467, CN2 464, and CN3 461 are needed. To perform the novel detection and correction of a weakly programmed cell, six additional comparators CL1 468, CU1 466, CL2 465, CU2 463, CL3 462, and CU3 460 are needed.

The selected cell 404 is biased by the wordline signal WL 408 to generate a cell current $I_{CELL}$. Reference currents are generated in the nine reference cells REF1–REF9 450–458. Each reference cell is biased to a specific gate bias as shown. In particular, a level 1 bias $V_{LEVEL1}$ 440 is used to generated the $I_{LEVEL1}$ current. The $I_{LEVEL1}$ is compared to $I_{CELL}$ by the normal level comparator for level 1 CN1 467. The CELL STATE LEVEL 1 signal corresponds to the level 1 state and also corresponds to the first reading described in the first embodiment. The upper margin of the level 1 state is measured using the upper comparator for level 1 CU1 466. An upper reference for level 1 $V_{UPPER1}$ 436 biases the REF7 cell to generate $I_{UPPER1}$. $I_{UPPER1}$ is used to measure the level 1 upper margin corresponding to the signal CELL STATE LEVEL 1 UPPER MARGIN 476 and also corresponding to the second reading of the first embodiment. The third reading of the first embodiment corresponds to the CELL STATE LEVEL 1 LOWER MARGIN 478. The $V_{LOWER1}$ signal 446 is used to generate the $I_{LOWER1}$ current in REF9 458.

Levels 1, 2, and 3 each require three comparators to perform the state detection and the weak programming state detection. Level 1 uses CL1 468, CN1 467, and CU1 466. Level 2 uses CL2 465, CN2 464, and CU2 463 to generate the CELL STATE LEVEL 2 LOWER MARGIN 475, CELL STATE LEVEL 2 474, and CELL STATE LEVEL 2 UPPER MARGIN 473. Level 3 uses CL3 462, CN3 461, and CU3 460 to generate the CELL STATE LEVEL 3 LOWER MARGIN 472, CELL STATE LEVEL 3 471, and CELL STATE LEVEL 3 UPPER MARGIN 470. Level 0 does not require additional comparators. In general, a programmable cell requires 3 comparators for each programming level excepting the '0' level. More generally, for an n-level cell, $3\times(n-1)$ comparators are required.

The advantages of the present invention may now be summarized. An effective and very manufacturable integrated circuit device is achieved. A method to detect and to correct weak cell states in a nonvolatile memory device is achieved. Bit errors are prevented in a nonvolatile memory device. An efficient method to selectively refresh memory cells in a nonvolatile memory device is achieved. A method to continuously detect weak cell states in a nonvolatile memory device is achieved. The present invention is extendible to multiple level memory devices. A nonvolatile memory device capable of detecting weak cell states is achieved.

As shown in the preferred embodiments, the novel method and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to detect and to correct a weakly programmed cell in a nonvolatile memory device comprising:

providing a plurality of nonvolatile memory cells;

providing a means to read a selected cell by comparing the performance of said selected cell with the performance of a reference cell wherein a read state of said selected cell is high if said selected cell exceeds said reference cell and wherein said read state of said selected cell is low if said selected cell exceeds said reference cell;

obtaining a first read state by reading said selected cell with said reference cell biased to a first value;

obtaining a second read state by reading said selected cell with said reference cell biased to a second value that is greater than said first value;

flagging said selected cell as weakly programmed, high if said first and second read states do not match;

obtaining a third read state by reading said selected cell with said reference cell biased to a third value that is less than said first value;

flagging said selected cell as weakly programmed, low if said first and third read states do not match;

refreshing said selected cell if said selected cell is weakly programmed.

2. The method according to claim 1 wherein said step of obtaining a first read state is always performed and wherein all other said steps are only performed in a test mode.

3. The method according to claim 2 wherein said test mode is controlled by a microprocessor device.

4. The method according to claim 1 wherein said steps of flagging said selected cell as weakly programmed, high if said first and second read states do not match and flagging said selected cell as weakly programmed, low if said first and third read states do not match are performed by a microprocessor device.

5. The method according to claim 1 wherein said nonvolatile memory cells are each capable of storing more than two memory states and wherein said steps of obtaining first, second, and third read states, and of flagging said5 selected cell as weakly programmed, high and of flagging said selected cell as weakly programmed, low are performed for each said memory state greater than two.

6. The method according to claim 1 further comprising storing said first read state of said selected cell in a separate memory device prior to said step or obtaining a second read state.

7. The method according to claim 1 further comprising the step of determining a filtered read state of said selected cell by a majority vote of said first, second, and third read states.

8.The method according to claim 7 wherein said step of determining a filtered read state of said selected cell by a majority vote of said first, second, and third read states is performed by microprocessor device.

9. The method according to claim 7 wherein said nonvolatile memory cells are each capable of storing more than two memory states and wherein said step of determining a filtered read state is repeated for each said memory state greater than two.

10. The method according to claim 1 wherein said means to read a selected cell is by a circuit comprising:
   a first said reference cell with said gate set to said first value;
   a first comparator coupled to said reference cell and to said selected cell wherein said first read state is the output of said first comparator;
   a second said reference cell with said gate set to said second value;
   a second comparator coupled to said reference cell and to said selected cell wherein said second read state is the output of said second comparator;
   a third said reference cell with said gate set to said third value; and
   a third comparator coupled to said reference cell and to said selected cell wherein said third read state is the output of said third comparator.

11. The method according to claim 1 wherein said first, second, and third read states are selectively output from said nonvolatile memory device to microprocessor device during a reading operation based on a signal from said microprocessor device.

12. The method according to claim 1 wherein said first, second, and third read states are always output from said nonvolatile memory device to a microprocessor device during a reading operation.

13. A nonvolatile memory device comprising:
   a plurality of nonvolatile memory cells;
   a means to determine a read state of a selected said cell by comparing performances of said selected cell and of a reference cell wherein said reference cell has a gate biased to a read value and wherein a read state of said selected cell is high if said selected cell exceeds said reference cell and wherein said read state of said selected cell is low if said selected cell exceeds said reference cell and further comprising:
   a first said reference cell with said gate set to a first value;
   a first comparator coupled to said reference cell and to said selected cell wherein said first read state is the output of said first comparator;
   a second said reference cell with said gate set to a second value;
   a second comparator coupled to said reference cell and to said selected cell wherein said second read state is the output of said second comparator;
   a third said reference cell with said gate set to a third value; and
   a third comparator coupled to said reference cell and to said selected cell wherein said third read state is the output of said third comparator; and
a microprocessor device capable of flagging any said selected cell wherein said second read state does not match said first read state as weakly programmed high.

14. The device according to claim 13 wherein said nonvolatile memory cells are each capable of storing more than two memory states and wherein an additional said means to determine a read state is included for each said memory state greater than two.

15. The device according to claim 13 further comprising a means to selectively output said first, second, and third read states from said nonvolatile memory device to a microprocessor device during a reading operation based on an external signal from said microprocessor device.

16. The device according to claim 13 wherein said first, second, and third read states are always output from said nonvolatile memory device to a microprocessor device during a reading operation.

17. The device according to claim 13 wherein said microprocessor device is capable of flagging any said cells wherein said third read state does not match said first read state as weakly programmed low.

18. The device according to claim 13 wherein said microprocessor device is capable of storing said first read states of said cells in a separate memory device.

19. The device according to claim 13 wherein said microprocessor device is capable of determining a filtered read state of any said selected cell by a majority vote of said first, second, and third read states.

20. The device according to claim 19 wherein said nonvolatile memory cells are each capable of storing more than two memory states and wherein additional said majority votes are performed for each said memory state greater than two.

21. A circuit device comprising:
   a nonvolatile memory device further comprising:
     a plurality of nonvolatile memory cells; and
     a means to determine a read state of a selected said cell by comparing performances of said selected cell and of a reference cell wherein said reference cell has a gate biased to a read value, wherein a read state of said selected cell is high if said selected cell exceeds said reference cell, and wherein said read state of said selected cell is low if said selected cell exceeds said reference and further comprising:
       a first said reference cell with said gate set to said first value;
       a first comparator coupled to said reference cell and to said selected cell wherein said first read state is the output of said first comparator;
       a second said reference cell with said gate set to said second value;
       a second comparator coupled to said reference cell and to said selected cell wherein said second read state is the output of said second comparator;
       a third said reference cell with said gate set to said third value; and
       a third comparator coupled to said reference cell and to said selected cell wherein said third read state is the output of said third comparator; and
     a microprocessor device capable of flagging any said selected cell wherein said second read state does not match said first read state as weakly programmed high and capable of flagging any said selected cell wherein said third read state does not match said first read state weakly programmed low.

22. The device according to claim 21 wherein said nonvolatile memory cells are each capable of storing more than two memory states and wherein an additional said means to determine a read state is included for each said memory state greater than two.

23. The device according to claim 21 further comprising a means to selectively output said first, second, and third read states from said nonvolatile memory device to said microprocessor device during a reading operation based on a signal from said microprocessor device.

24. The device according to claim 21 wherein said first, second, and third read states are always output from said nonvolatile memory device to said microprocessor device during a reading operation.

25. The device according to claim 21 further comprising a separate memory device coupled to said microprocessor device.

26. The device according to claim 21 wherein said microprocessor device is capable of comparing said second and third read states with data stored in said separate memory device.

27. The device according to claim 21 wherein said microprocessor device is capable of determining a filtered read state of any said selected cell by a majority vote of said first, second, and third read states.

28. The device according to claim 19 wherein said nonvolatile memory cells are each capable of storing more than two memory states and wherein additional said majority votes are performed for each said memory state greater than two.

* * * * *